AC SWITCHING CIRCUIT

Filed June 24, 1968

INVENTOR
LLOYD H. DIXON, JR.
BY Joseph Weingarten
Stanley M. Schanzer
ATTORNEYS

United States Patent Office 3,487,231

Patented Dec. 30, 1969

3,487,231

AC SWITCHING CIRCUIT

Lloyd H. Dixon, Jr., Boxford, Mass., assignor to Unitrode Corporation, Watertown, Mass., a corporation of Maryland Filed June 24, 1968, Ser. No. 739,228

Int. Cl. H02b *1/24;* H01h *33/59, 47/00*

U.S. Cl. 307—113 6 Claims

ABSTRACT OF THE DISCLOSURE

A low level high speed AC switching circuit wherein the reverse gain properties of a thyristor are employed to enhance circuit switching performance. Extremely small triggering signals are applied to the gate of one thyristor, its reverse anode current during the reverse mode causing the triggering of a second thyristor.

Field of the invention

This invention relates to semiconductor circuits and more particularly to semiconductor switching circuits.

Background of the invention

The triac is a semiconductor device often used for alternating current (AC) switching. The latching current required to trigger a conventional triac is usually at least an order of magnitude greater than the holding current necessary to maintain the latched condition of the device. Relatively large anode currents and gate drive are, therefore, necessary in order to switch on such conventional devices. In addition, at higher frequencies, such devices often latch on due to internal mechanisms, thereby limiting their use to lower frequencies, generally the power frequencies of 60–400 Hz. By reason of the inherent slow speed and insensitivity of triacs, they are, therefore, limited to high power low frequency applications. In an attempt to overcome such deficiencies of operation, circuits employing a pair of thyristors in back-to-back relationship have been employed for AC switching, but these circuits have not been completely satisfactory. Independent triggering for the gates of each thyristor must be provided to successively trigger each thyristor in timed relation to the input AC signal to achieve the requisite switching operation. The trigger source for such circuits must, therefore, be capable of supplying trigger pulses to both thyristors, and triggering is further complicated by the different reference levels of the respective thyristor gate electrodes. It is, therefore, an object of this invention to provide a switching circuit, similar in operation to a triac, which is easily triggered and which is operative at low signal levels and up to relatively high frequencies.

Summary of the invention

Briefly, the present invention comprises a low level high speed AC switching circuit in which the reverse gain properties of a first thyristor are employed to trigger a second thyristor to achieve markedly improved triggering performance. The present invention makes use of the reverse gain properties of a thyristor which are not normally employed, and which are in fact often deleterious in conventional circuitry. A first thyristor having predetermined reverse gain properties is connected across a source of AC potential, and a second thyristor is connected with opposite polarity to the first thyristor across this same source. The anode of the first thyristor is connected to the gate electrode of the second thyristor, while the gate electrode of the first thyristor is coupled to a suitable trigger source.

In operation, the first thyristor is triggered upon receipt of a suitable signal from the trigger source, causing an anode current from the first thyristor to flow through a load. When the AC potential becomes negative, the first thyristor switches off and a second trigger signal is applied to the gate electrode of this thyristor to cause a reverse anode current to flow, this reverse anode current being coupled to the gate electrode of the second thyristor to switch it on, thereby causing anode current to flow through the load from the anode of the second thyristor. The application of trigger signals to the gate terminal of the first thyristor once each half cycle causes the circuit to supply alternating current to the load. Proportional power control can also be achieved by delaying the time of occurrence of the trigger signals with respect to the AC supply voltage to cause switching of the thyristors during selected portions of the AC wave.

It is a particular feature of the invention that the triggering signal is applied to the gate electrode of only the first thyristor, the necessary triggering signal for the second thyristor being derived according to the invention by the novel use of the reverse gain properties of the first thyristor. The circuit operates at extremely low levels, generally requiring a maximum gate current of only three milliamperes to provide the necessary triggering. In addition, the circuit can operate up to frequencies of approximately twenty kilohertz without spurious latching.

Description of the drawings

The invention will be more fully understood from the following detailed description, taken in conjunction with the accompanying drawings, in which.

Detailed description of the invention

Figure 1:
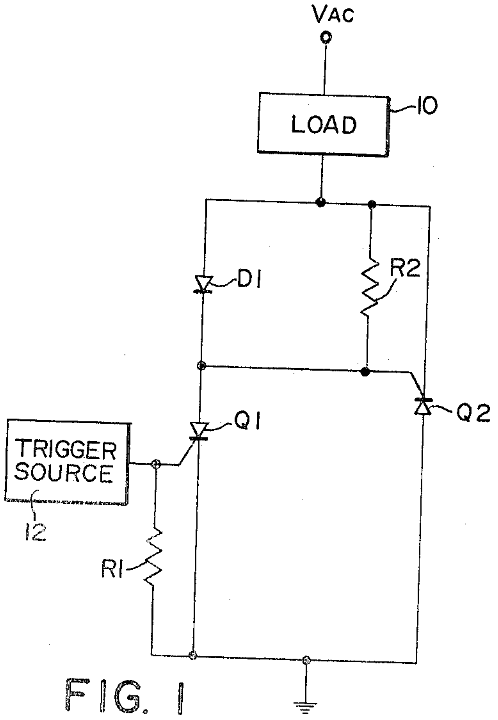
FIG. 1 is a schematic diagram of an AC switching circuit according to the present invention.

Referring to FIG. 1, there is shown a novel circuit useful to provide low level high speed AC switching. A first thyristor Q1 has its anode connected through a diode D1 and a load 10 to a source $V_{AC}$ of AC potential. Diode D1 is connected in the same polarity as thyristor Q1. A second thyristor Q2 is connected with opposite polarity to that of thyristor Q1, with its cathode connected to load 10, its anode connected to a source of reference potential such as ground, and its gate electrode connected to the anode of thyristor Q1. The gate electrode of thyristor Q1 is connected to a trigger source 12, and a resistor R1 is connected between the gate electrode of thyristor Q1 and ground. A second resistor R2 is connected between the gate electrode of thyristor Q2 and load 10. The resistors R1 and R2 are provided to prevent self triggering of the thyristors which may occur due to leakage currents or transient voltage conditions. However, such resistors are not essential to proper circuit operation and can be eliminated if particular thyristors are employed having suitable minimum triggering current. In accordance with the principles of the invention, thyristor Q1 has a reverse anode current sufficient to trigger the second thyristor Q2. The characteristics of the thyristors are such that a current of approximately three milliamperes applied to the gate electrode of thyristor Q1 causes a reverse anode current of about one-half to one milliampere, which is sufficient to trigger thyristor Q2.

Depending upon the type of triggering employed, the circuit of FIG. 1 can be used as a static switch or as a proportional control. In static switching applications, the circuit can deliver a wide range of currents to a load.

Figures 3A, 3B, 3C:
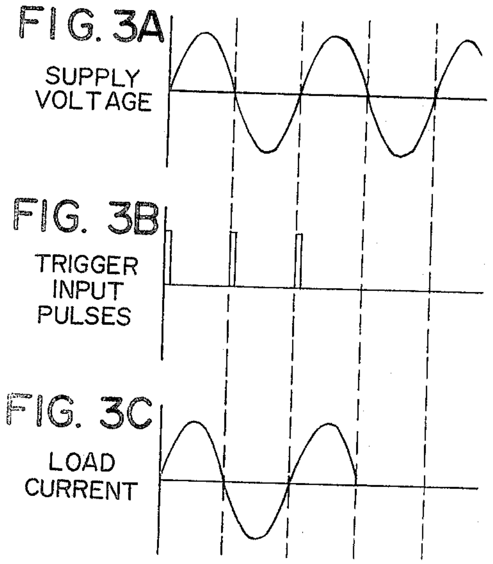
FIGS. 3A–3C are waveforms useful in explaining the operation of the novel circuit for static switching.

The operation of the circuit for static switching will now be described in conjunction with the waveforms of FIGS. 3A–3C. An AC supply voltage $V_{AC}$, depicted in FIG. 3A, is applied to the circuit, and when the voltage crosses through zero in the positive direction, a trigger pulse (FIG. 3B) is applied to the gate electrode of thyristor Q1, causing it to latch on for the duration of the positive half cycle of the AC supply voltage. During this positive half cycle, anode current from thyristor Q1 will flow through load 10 and diode D1, as seen in FIG. 3C. When the supply voltage drops to zero, thyristor Q1 will switch off. When the AC supply voltage crosses zero in the negative direction, a second positive pulse (FIG. 3B) is applied from trigger source 12 to the gate electrode of thyristor Q1, causing a reverse anode current to flow from the anode of thyristor Q1. This reverse anode current is blocked by the diode D1 and is thereby caused to flow into the gate electrode of thyristor Q2. Since at this instant the supply voltage is negative, thyristor Q2 is biased in the forward direction and will, therefore, latch on for the duration of the negative half cycle of the supply voltage, allowing load current to flow during this half cycle. When the supply voltage again passes through zero, thyristor Q2 will turn off. Operation continues similarly for each half cycle of the supply voltage. Thus, the application of positive triggering pulses to the gate electrode of thyristor Q1 once each half cycle causes the circuit to supply alternating current to load 10.

A circuit of the type shown in FIG. 1 has been constructed with the following component values to achieve particularly effective performance:

| | |
|---|---|
| Thyristor Q1 | SSPI CB1077. |
| Thyristor Q2 | SSPI AA102. |
| Diode D1 | Unitrode UT113. |
| Resistors R1 and R2 | 1K ohms. |
| $V_{AC}$ | 110 volts, 60 Hz.–20 kHz. |

The circuit having the foregoing values operates with an extremely low gate current of about three milliamperes to provide load currents in the range of about one ampere to one milliampere.

The circuit can be triggered either by a pulse source or by a direct current (DC) source, depending upon the particular application. For example, in those instances where direct current triggering is desired, trigger source 12 can provide a direct current of requisite magnitude to cause the flow of bi-directional load current so long as the DC source signal is applied to the gate electrode of thyristor Q1.

Figures 4A, 4B, 4C:
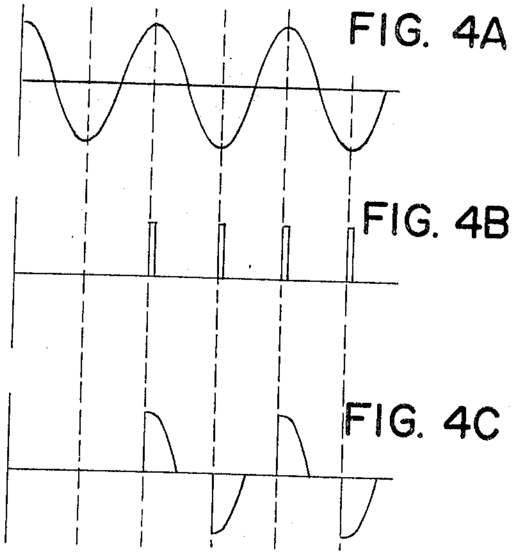
FIGS. 4A–4C are waveforms useful in explaining the operation of the novel circuit for proportional control.

Proportional control is provided by the present circuit by providing trigger pulses to the gate electrode of thyristor Q1 in timed relation to the period of the AC supply voltage. Such proportional control is illustrated with reference to the waveforms of FIGS. 4A–4C. FIG. 4A shows the AC supply voltage applied to the circuit, and FIG. 4B illustrates the trigger pulses applied from trigger source 12 to the gate electrode of thyristor Q1. In this instance, the trigger pulses occur during the alternate positive and negative peaks of the supply voltage. Thus, as depicted in FIG. 4C, each respective thyristor is turned on upon occurrence of the input trigger pulse and remains on for the remainder of that half cycle. When the trigger pulse occurs during the positive half cycle of the AC supply voltage, thyristor Q1 is latched on for the remainder of that half cycle causing positive current to flow through load 10. When the AC supply voltage passes through zero, thyristor Q1 is switched off. When the next input pulse is applied during the negative half cycle of the supply voltage, reverse anode current from thyristor Q1 triggers thyristor Q2, causing load current to flow during the remainder of that negative half cycle. The duration of the latching time during each alternate half cycle is adjustable by varying the time of occurrence of the trigger pulses with respect to the corresponding periodicity of the input supply voltage.

Figure 2:
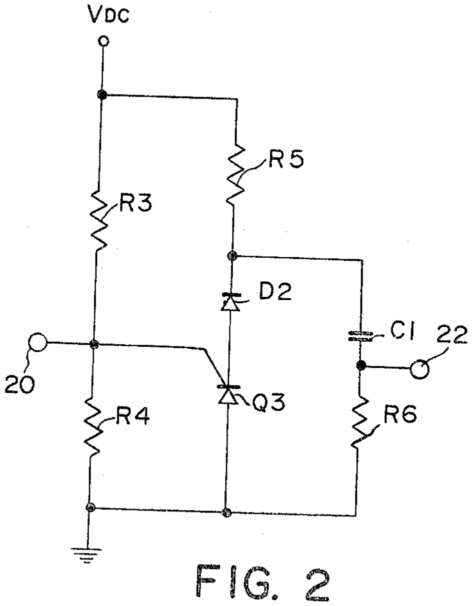
FIG. 2 is a schematic diagram of a pulse circuit useful as a trigger source for the circuit of FIG. 1.

A variety of circuits can be employed to provide the requisite trigger signals, a typical pulse circuit useful for the purpose being depicted in FIG. 2. As will be evident, this circuit can provide trigger pulses to effect both static switching and proportional control, as desired. The circuit includes a voltage divider including resistors R3 and R4 serially connected between a source of negative DC potential ($-V_{DC}$) and a source of reference potential, such as ground, the junction of resistors R3 and R4 being connected to the gate electrode of a thyristor Q3. The anode of thyristor Q3 is connected to ground, and the cathode is connected to the anode of a diode D2, the cathode of which is connected via a resistor R5 to the source of negative potential. A serially connected capacitor C1 and resistor R6 are connected in the order named between the cathode of diode D2 and the anode of thyristor Q3. The output of the circuit is taken at the junction between capacitor C1 and resistor R6, while the input of the circuit is at the junction of resistors R3 and R4.

In operation, a source voltage of typically −20 volts is applied to the supply terminal $-V_{DC}$. A bias voltage is thus applied to the gate electrode of thyristor Q3 by the voltage divider action of resistors R3 and R4, and this bias voltage can be adjusted by choice of resistance values to determine the time when the circuit will trigger. In this manner, the time of occurrence of an output pulse can be selected. An AC signal can be applied to terminal 20 to synchronize the generation of output pulses with the line. An output pulse is provided for each half cycle of the input signal. At the beginning of each half cycle, capacitor C1 is discharged and diode D2 is reverse biased, as is thyristor Q3. As capacitor C1 charges, the voltage appearing at the cathode of diode D2 decreases, and when the voltage decreases to a value below the fixed gate bias applied to the gate electrode of thyristor Q3, the thyristor switches on causing the discharge of capacitor C1 and the consequent generation of an output pulse at output terminal 22. The output pulses are applied to the gate electrode of thyristor Q1 in the circuit of FIG. 1 to provide the necessary triggering.

Typical component values for the trigger circuit of FIG. 2 are as follows:

| | |
|---|---|
| Thyristor Q3 | SSPI AA102. |
| Diode D2 | Unitrode UT113. |
| Resistors R3, R4 and R5 | 10K ohms. |
| Resistor R6 | 100 ohms. |
| Capacitor C1 | 1 microfarad. |
| $-V_{DC}$ | −20 volts. |

From the foregoing, it is evident that an AC switching circuit has been provided which is operative at low signal levels and over a relatively wide frequency range. The invention is not to be limited by what has been particularly shown and described except as indicated in the appended claims.

What is claimed is:

1. An AC switching circuit comprising:
   - a first thyristor having predetermined reverse gain properties adapted to be connected between a source of AC voltage and a source of reference potential;
   - a second thyristor adapted to be connected between a source of AC voltage and a source of reference potential in a polarity opposite to the first thyristor;
   - means connecting the anode of said first thyristor to the gate of said second thyristor;
   - means for applying triggering signals to the gate of said first thyristor; and
   - load means connected between said source of AC potential and said first and second thyristors.

2. An AC switching circuit according to claim 1 including a diode having its cathode connected to the anode of said first thyristor and its anode connected to said load, said diode being operative to pass forward current from said first thyristor and to block reverse current from said first thyristor.

3. An AC switching circuit according to claim 1 wherein said triggering signal means includes a circuit for providing pulses in predetermined timed relation to said AC voltage, whereby each thyristor is caused to conduct for the portion of the respective half cycle of said AC voltage following each pulse.

4. An AC switching circuit according to claim 1 wherein said triggering signal means includes a source of DC potential, whereby each thyristor is caused to conduct for each respective half cycle of said AC voltage.

5. An AC switching circuit according to claim 1 wherein the reverse gain properties of said first thyristor include a reverse anode current of a magnitude sufficient to trigger said second thyristor.

6. An AC switching circuit according to claim 1 including:

a first resistor connected between said source of reference potential and the gate of said first thyristor;

a second resistor connected between the gate of said second thyristor and said load; and a diode having its cathode connected to the anode of said first thyristor and its anode connected to said load.

References Cited

UNITED STATES PATENTS

| | | |
|---|---|---|
| 3,223,911 | 12/1965 | Seiler et al. |
| 3,238,390 | 3/1966 | Pinckaers. |

ROBERT K. SCHAEFER, Primary Examiner

T. B. JOIKE, Assistant Examiner

U.S. Cl. X.R.

307—252; 323—24, 34, 38